United States Patent
Hsu et al.

(10) Patent No.: US 7,233,177 B2
(45) Date of Patent: Jun. 19, 2007

(54) PRECISION TUNING OF A PHASE-CHANGE RESISTIVE ELEMENT

(75) Inventors: Louis C. Hsu, Fishkill, NY (US); Brian L. Ji, Fishkill, NY (US); Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 11/098,078

(22) Filed: Apr. 4, 2005

(65) Prior Publication Data

US 2006/0220688 A1    Oct. 5, 2006

(51) Int. Cl.
*H03K 5/22* (2006.01)
*G06G 7/28* (2006.01)

(52) U.S. Cl. ..................... 327/78; 327/334
(58) Field of Classification Search ............ 327/63–64, 327/72, 77–79, 82, 88–90, 407, 415, 525; 365/100, 189.02, 189.07
See application file for complete search history.

(56) References Cited

U.S. PATENT DOCUMENTS

| | | | |
|---|---|---|---|
| 5,296,835 A | 3/1994 | Nakamura | |
| 5,790,331 A * | 8/1998 | Aranovsky | 360/46 |
| 6,204,139 B1 | 3/2001 | Liu et al. | |
| 6,381,491 B1 * | 4/2002 | Maile et al. | 607/2 |
| 6,429,685 B1 * | 8/2002 | Stockstad | 326/83 |
| 6,608,773 B2 | 8/2003 | Lowrey et al. | |
| 6,673,691 B2 | 1/2004 | Zhuang et al. | |
| 6,795,338 B2 | 9/2004 | Parkinson et al. | |
| 2004/0252544 A1 | 12/2004 | Lowrey et al. | |

* cited by examiner

*Primary Examiner*—My-Trang Nu Ton
(74) *Attorney, Agent, or Firm*—Gibb & Rahman, LLC; Wan Yee Cheung, Esq.

(57) ABSTRACT

The present invention comprises a method and structure for programming an on-chip phase-change resistor to a target resistance. Using an off-chip precision resistor as a reference, a state-machine determines a difference between the resistance of an on-chip resistor and the target resistance. Based upon this difference, the state machine directs a pulse generator to apply set or reset pulses to the on-chip resistor in order to decrease or increase, respectively, the resistance of the resistor, as necessary. In order to program the resistance of the phase-change resistor to a tight tolerance, it is successively reset and set by applying progressively decreasing numbers of reset pulses and set pulses, respectively, until the number of set pulses is equal to one and the target resistance of the on-chip resistor is reached.

35 Claims, 6 Drawing Sheets

PRECISION TUNING OF A PHASE-CHANGE RESISTIVE ELEMENT

BACKGROUND OF THE INVENTION

1. Field of the Invention

The present invention relates generally to tuning phase-change resistive elements. More particularly, the present invention relates to a method and apparatus for using an off-chip precision resistor as a reference to tune one or more on-chip phase-change resistive elements.

2. Description of the Related Art

The electrical resistance of resistance switching materials (i.e., phase-change materials), including but not limited to chalcogenides and alloys thereof, and perovskites or per-ovskite-like materials (e.g., colossal magnetorisistance (CMR) materials and high temperature superconductivity (HTSC) materials), can be changed significantly by external influences, including temperature, magnetic fields and electric fields. In their amorphous states, these phase-change materials exhibit a higher resistance because electrons move slower through the material. In semi-crystalline or semi-amorphous states, resistance switching materials can exhibit less resistance. Finally, in their crystalline states, resistance switching materials exhibit low resistance because electrons are able to move fast through the material. Electrical impulses applied to theses materials can "tune" or "program" them, such that they exhibit the desired resistive property. For example, applying a "set" current having a specific pulse height and width to a phase-change material will crystallize it, thereby, decreasing the resistance. Similarly, applying a "reset" current having another specific pulse height and width to the phase change material will return the material to its amorphous state, thereby, increasing the resistance. The following U.S. Patents, and U.S. Patent Applications, incorporated herein by reference, discuss phase-change materials and methods for switching the resistances of such materials: U.S. Pat. No. 6,673,691 issued to Zhuang et al. on Jan. 6, 2004; U.S. Pat. No. 6,204,139 issued to Liu et al. on Mar. 20, 2001; and, U.S. Patent Application Pub. No. US 2004/0252544 to Lowery et al. on Dec. 16, 2004. Incorporating phase-change resistive elements into integrated circuits is known. For example, phase-change resistive elements can be used to form programmable resistance memory elements, as disclosed in the following U.S. Patents and U.S. Patent Application, incorporated herein by reference: U.S. Patent Application Pub. No. US 2004/0252544, referred to above, U.S. Pat. No. 6,608,773 issued to Lowrey et al. on Aug. 16, 2003; and, U.S. Pat. No. 6,795,338 issued to Parkinson et al. on Sep. 21, 2004. Similarly, U.S. Pat. No. 5,296,835, issued to Nakamura on Mar. 22, 1994 (incorporated herein by reference) disclosed a device that incorporates a variable resistor constructed to a desirable resistance using a chalcogenide semiconductor. However, precision tuning of on-chip phase-change resistive elements to a target resistance with a tight tolerance can be difficult. The present invention relates to a method and apparatus for the precision tuning of one or more on-chip phase-change resistive elements.

SUMMARY OF THE INVENTION

This disclosure presents a method and device for programming an on-chip phase-change resistive element (or a network of on-chip phase-change resistive elements) to a target resistance. Using an off-chip precision resistor, having a known resistance, as a reference, a state-machine determines the relative resistance of the on-chip resistor (or the resistor network) compared to the target resistance. Based upon this relative resistance, the state machine directs a pulse generator to apply set or reset pulses to the on-chip resistor (or to at least one on-chip resistor in the network) to decrease or increase, respectively, the resistance of the phase change resistor (or the resistor network), as necessary. In order to program the resistance to a tight tolerance, the on-chip phase-change resistor (or the at least one on-chip resistor in the network) is successively reset and set by applying progressively decreasing numbers of reset pulses and set pulses, respectively, until the number of set pulses is equal to one and the target resistance of the on-chip resistor (or network of on-chip resistors) is reached.

One embodiment of the invention discloses a method of programming a single on-chip phase-change resistor. The method comprises first resetting the on-chip resistor to a maximum resistance by applying a predetermined number of reset pulses to the on-chip resistor. Once the on-chip resistor reaches its maximum resistance, it is set to a resistance that is less than the target resistance by applying a predetermined number of set pulses to the on-chip resistor. Thereafter, alternating groups of reset pulses and set pulses, having progressively decreasing numbers of pulses, are applied to the on-chip resistor in order to successively reset and set the on-chip resistor to a resistance that progressively closer to the target resistance. The predetermined number of set pulses is determined to be that number of pulses that is divisible by an integer N, where N is less than 10 (e.g., N is equal to four) and that is sufficient to decrease the resistance of the on-chip resistor below the target resistance. The predetermined number of set pulses is then divided by two to determine the number of pulses for a first alternating group of reset pulses. Similarly, the number of pulses of the first alternating group of reset pulses is divided by two to determine the number of pulses for a next alternating group of set pulses, and so on. The process of resetting and setting the on-chip resistor continues until the number of pulses is equal to one and the resistance of the on-chip resistor reaches the target resistance.

Between each alternating group of reset and set pulses, the on-chip resistor is read to determine its relative resistance as compared to a target resistance using the known resistance of an off-chip resistor as a reference. Specifically, a supply voltage is input into the off-chip resistor and the on-chip resistor. A constant mirrored current flow is then established from the off-chip resistor to the on-chip resistor (e.g., via corresponding tail devices assemblies connected to the off-chip resistor and the on-chip resistor, respectively). An output voltage from the on-chip resistor is then detected, compared to a predetermined reference voltage, and the difference between the reference voltage and the output voltage is analyzed. When the current flowing between the off-chip resistor and the on-chip resistor is the same and constant, then any difference between the output voltage of the on-chip resistor and the predetermined reference voltage indicates a difference in the resistance of the off-chip resistor as compared to that of the on-chip resistor. The predetermined reference voltage is determined such that it is equal to the supply voltage reduced by a predicted amount of voltage consumed by the circuit during the process of determining the relative resistance of the on-chip resistor. The predicted amount of voltage consumption is based upon the known resistance of the off-chip resistor and the target resistance of the on-chip resistor. The difference between the output voltage of the on-chip resistor and the predetermined reference voltage is analyzed in order to determine if a setting process or resetting process is necessary. For example, when the reference voltage is greater than the output voltage, thereby indicating that the resistance of the on-chip resistor is greater than the target resistance, a setting process is necessary. When the reference voltage is less than the output voltage, thereby indicating that the resistance of the on-chip resistor is less than the target resistance of the off-chip resistor, a resetting process is necessary. Thus, if, after applying one of the groups of set pulses, the reference voltage is greater than the output voltage, then that group of the set pulses is reapplied. Otherwise, the next group of reset pulses is applied. Similarly, if, after applying one of the groups of reset pulses, the reference voltage is less than the output voltage, then that group of reset pulses is reapplied. Otherwise, the next group of set pulses is applied.

Another embodiment of the invention discloses a method of programming the resistance of a network of on-chip resistors. The method comprises first selecting at least one on-chip resistor in the network of on-chip resistors for programming and then, temporarily disconnecting that on-chip resistor from the network. The selected on-chip resistor is reset to a maximum resistance. Then, the resistance of the selected on-chip resistor is set such that the total resistance of the network drops below the target resistance. Next, the selected on-chip resistor is successively reset and set in order to progressively adjust the resistance of the network closer to the target resistance. This is accomplished by applying alternating groups of reset pulses and set pulses with progressively decreasing numbers of pulses. The predetermined number of set pulses is determined to be that number of pulses that is divisible by an integer N, where N is less than 10 (e.g., N is equal to four) and that is sufficient to decrease the resistance of the selected on-chip resistor enough to decrease the overall resistance of the network below the target resistance. The predetermined number of set pulses is divided by two to determine the number of pulses for a first alternating group of reset pulses. Then, the number of pulses for the first alternating group of reset pulses is divided by two to determine the number of pulses for the next alternating group of set pulses and so on. The process of successively resetting and setting the at least one on-chip resistor continues until the number of pulses is equal to one.

Between applying of the alternating groups of reset pulses and set pulses, the at least one on-chip resistor is reconnected to the network and the network is read to determine the relative resistance of the network as compared to the target resistance based upon a known resistance of an off-chip resistor. Specifically, a supply voltage is input into the off-chip resistor and also into the on-chip resistor network. A constant mirrored current flow is then established from the off-chip resistor to the on-chip resistor network (e.g., via corresponding tail devices assemblies connected to the off-chip resistor and the on-chip resistor network, respectively). An output voltage from the on-chip resistor network is then detected, compared to a predetermined reference voltage, and the difference between the reference voltage and the output voltage is analyzed. When the current flowing between the off-chip resistor and the on-chip resistor is the same and constant, then any difference between the output voltage of the on-chip resistor network and the predetermined reference voltage indicates a difference in the resistance of the off-chip resistor as compared to that of the on-chip resistor network. The predetermined reference voltage is determined such that it is equal to the supply voltage reduced by a predicted amount of voltage consumption during the read process. The predicted amount of voltage consumption is based upon the known resistance of the off-chip resistor and the target resistance of the network. The difference between the predetermined reference voltage and the output voltage of the on-chip resistor network is analyzed to determine if a setting or resetting process is necessary. For example, when the reference voltage is greater than the total output voltage, thereby indicating that the resistance of the network is greater than the target resistance, a setting process is necessary. When the reference voltage is less than the total output voltage, thereby indicating that the resistance of the network is less than the target resistance, a resetting process is necessary. Thus, if, after applying one of the groups of set pulses, the reference voltage is greater than the total output voltage, then that group of the set pulses is reapplied. Otherwise, the next group of reset pulses is applied. If, after applying one of the groups of reset pulses, the reference voltage is less than the total output voltage, then that group of reset pulses is reapplied. Otherwise, the next group of set pulses is applied.

Another embodiment of the invention discloses a device for programming the resistance of a single on-chip phase-change resistor. The device comprises a read circuit and a programming circuit. The read circuit is adapted to determine the relative resistance of the on-chip resistor relative compared to the target resistance. The programming circuit is adapted to adjust the resistance of the on-chip resistor to the target resistance in response to feedback from the read circuit.

The read circuit comprises the on-chip resistor, an off-chip resistor, a state machine and a power source. The off-chip resistor has a known resistance and is electrically connected to a first tail device assembly. The on-chip resistor is connected to a corresponding second tail device assembly. Corresponding individual tail devices of the first and second tail device assemblies are electrically connected, thereby, electrically connecting the off-chip resistor to the on-chip resistor. The power source is adapted to input a supply voltage into the on-chip resistor and the off-chip resistor such that a current flows between the corresponding individual tail devices of the first tail device assembly and the second tail device assembly. A pad connected to the off-chip resistor is adapted to measure the voltage output of the off-chip resistor. A first differential amplifier connected to the pad is adapted to compare the voltage output of the off-chip resistor to a predetermined reference voltage and to regulate the current flow so that a same constant current flows from the tail devices of the first tail device assembly to the tail devices of second tail device assembly. When the current flowing through the corresponding tail device assemblies is constant and mirrored, then any difference between the output voltage of the on-chip resistor and the predetermined reference voltage indicates a difference in the resistance of the off-chip resistor as compared to the on-chip resistor. A second differential amplifier is adapted to receive an output voltage from the on-chip resistor and to compare it to the predetermined reference voltage. A state machine is adapted to analyze the difference between the two voltages to determine if a resetting or setting process is required. The predetermined reference voltage is determined as a voltage that is equal to the supply voltage reduced by a predicted amount of voltage consumption by the read circuit. The predicted amount of voltage consumption is based upon the known resistance of the off-chip resistor and the target resistance of the on-chip resistor. Thus, if the output voltage is greater than the reference voltage, then the resistance of the on-chip resistor is less than the target resistance and if the output voltage is less than the reference voltage, then the resistance of the on-chip resistor is greater than the target resistance. Two identical biasing circuits are adapted to establish and to direct the same predetermined reference voltage towards the first differential amplifier and to the second differential amplifier, respectively.

The programming circuit comprises a multiplexer electrically connected to the state machine and the on-chip resistor; and, a pulse generator electrically connected to the multiplexer. The pulse generator is adapted to jointly output reset pulses and set pulses to the multiplexer. The multiplexer is adapted to separately output the reset pulses and the set pulses to the on-chip resistor. The state machine is adapted to compare output voltage to the reference voltage after each group of set pulses and reset pulses is applied to the on-chip resistor. Based upon this comparison, the state machine is adapted to control the multiplexer by directing the multiplexer to output a given number (i.e., a group) of reset pulses or the set pulses. The state machine is adapted to direct the multiplexer to output a group of set pulses when the reference voltage is greater than the output voltage, thereby indicating that the resistance of the on-chip resistor is greater than the target resistance, and to output a group of reset pulses when the reference voltage is less than the output voltage, thereby indicating that the resistance of the on-chip resistor is less than the target resistance. In order to program the phase-change material of the resistor to a target resistance, the state machine can be adapted to direct the multiplexer to output a first group of reset pulses, to output a first group of set pulses, and then to output successive alternating groups of reset pulses and set pulses. The given number of reset pulses of the first group of reset pulses should be sufficient to reset the resistance of the phase-change material to a maximum resistance. The given number of set pulses of the first group of set pulses should be sufficient to set the resistance of the on-chip phase-change resistor to a resistance that is less than the target resistance. The given number of pulses of the alternating groups should be progressively decreasing, but sufficient to successively reset and set the resistance of the on-chip resistor above and below the target resistance, until the given number of pulses is equal to one and the target resistance is reached. If applying a group of setting or resetting pulses does not adequately set or reset the resistance of the phase change material, the state machine can be adapted to reapply the same group of set or reset pulses. The state machine can comprise an algorithm adapted to determine the given number of pulses for each of the alternating groups of reset pulses and set pulses.

Another embodiment of the invention discloses a device for programming the resistance of a network of on-chip phase-change resistors. The device comprises a read circuit and a programming circuit. The read circuit is adapted to determine the relative resistance of the network as compared to the target resistance. The programming circuit adapted to program the at least one on-chip phase-change resistor in the network in order to adjust the resistance of the entire network to the target resistance in response to feedback from the read circuit.

The read circuit comprises the network of on-chip resistors, an off-chip resistor, a state-machine and a power source. The off-chip resistor has a known resistance and is electrically connected to a tail device assembly. The on-chip resistor network is connected to a corresponding tail device assembly. Corresponding individual tail devices of the first and second tail device assemblies are electrically connected, thereby, electrically connecting the off-chip resistor to the on-chip resistor network. The power source is adapted to input a supply voltage into the on-chip resistor network and into the off-chip resistor such that a current flows from the individual tail devices of the first tail device assembly to the corresponding tail devices of the second tail device assembly. A pad connected to the off-chip resistor is adapted to measure the voltage output of the off-chip resistor. A first differential amplifier connected to the pad is adapted to compare the voltage output of the off-chip resistor to a predetermined reference voltage. The first differential amplifier then regulates the current flow so that a same constant current flows from the individual tail devices of the first tail device assembly to the corresponding tail devices of the second tail device assembly. When the current flowing through the corresponding tail device assemblies is constant and mirrored, then any difference between the output voltage of the on-chip resistor network and the predetermined reference voltage indicates a difference in the resistance of the off-chip resistor as compared to the on-chip resistor network. A second differential amplifier is adapted to receive a total output voltage from the network of on-chip resistors and to compare the total output voltage to the predetermined reference voltage. A state machine electrically connected to the second differential amplifier is adapted to analyze a difference between the total output voltage of the on-chip resistor network to the predetermined reference voltage and to determine if a resetting or setting process is required. The predetermined reference voltage is determined to be a voltage that is equal to the supply voltage reduced by a predicted amount voltage consumption amount by the read circuit. The predicted voltage consumption amount is based upon the known resistance of the off-chip resistor and the target resistance of the network of on-chip resistors. Thus, if the total output voltage is greater than the reference voltage, then the resistance of the network is less than the target resistance. If the total output voltage is less than the reference voltage, then the resistance of the network is greater than the target resistance. Two identical biasing circuits are adapted to establish and to direct the same predetermined reference voltage towards the first differential amplifier and towards the second differential amplifier, respectively.

The programming circuit comprises a decoder electrically connected to each of the on-chip resistors in the network and adapted to select at least one of the on-chip resistors in the network for programming. It further comprises a multiplexer electrically connected to the state machine and the network; and, a pulse generator electrically connected to the multiplexer. The pulse generator is adapted to jointly output reset pulses and set pulses to the multiplexer. The multiplexer is adapted to separately output the reset pulses and the set pulses to the network. The state machine can be adapted to compare the total output voltage to the reference voltage after each group of reset pulses and set pulses are applied to the on-chip resistor selected for programming. Based upon this comparison, the state machine is adapted to control the multiplexer by directing the multiplexer to output a given number (i.e., a group) either reset pulses or set pulses. The state machine can be adapted to direct the multiplexer to output a group of set pulses when the reference voltage is greater than the total output voltage, thereby indicating that the resistance of the network is greater than the target resistance, and to output a group of reset pulses when the reference voltage is less than the output voltage, thereby indicating that the resistance of the network is less than the target resistance. In order to program a resistor and thereby adjust the resistance of the network to the target resistance, the state machine can direct the multiplexer to output a first group of reset pulses, to output a first group of set pulses, and to output successive alternating groups of reset pulses and set pulses. The given number of the reset pulses of the first group of reset pulses should be sufficient to reset the at least one on-chip resistor to a maximum resistance. The given number of the set pulses of the first group of set pulses should be sufficient to set the at least one on-chip resistor to a resistance that decreases the resistance of the network below the target resistance. The given number of the pulses of the alternating groups should progressively decrease, but be sufficient to successively set and reset the at least one on-chip resistor such that the resistance of the network, respectively, rises above and drops below the target resistance, until the given number of pulses is equal to one and the target resistance is reached. The state machine can comprises an algorithm adapted to determine the given number of pulses for each of group of set pulses and reset pulse.

Additionally, this embodiment of the device comprises second multiplexers that are electrically connected to the decoder, the multiplexer, the power source, and to corresponding on-chip resistors in the network. The decoder is further adapted to transmit a read signal to each of the second multiplexers when the network is being read and to transmit a programming signal to a corresponding one of the second multiplexers when the corresponding on-chip resistor is selected for programming. Each of the second multiplexers is adapted to temporarily disconnect the corresponding on-chip resistor from the network and to output the one of the reset pulses and the set pulses to the corresponding on-chip resistor, upon receiving a program signal. Each of second multiplexers is further adapted to reconnect the corresponding on-chip resistor to the network and to output the supply voltage from the power source to the network, upon receiving a read signal. The device also comprises third multiplexers that are electrically connected to the decoder, a ground line, a total output voltage line and a corresponding one of the on-chip resistors in the network. The decoder is adapted to transmit a read signal to each of the third multiplexers when the network is being read and to transmit a programming signal to a corresponding one of the third multiplexers when the corresponding on-chip resistor is selected for programming. The plurality of third multiplexers are each adapted to receive an individual output voltage from the corresponding on-chip resistor, to output the individual output voltage to the total output voltage line upon receiving the read signal, and to output the individual output voltage to the ground line upon receiving the programming signal.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
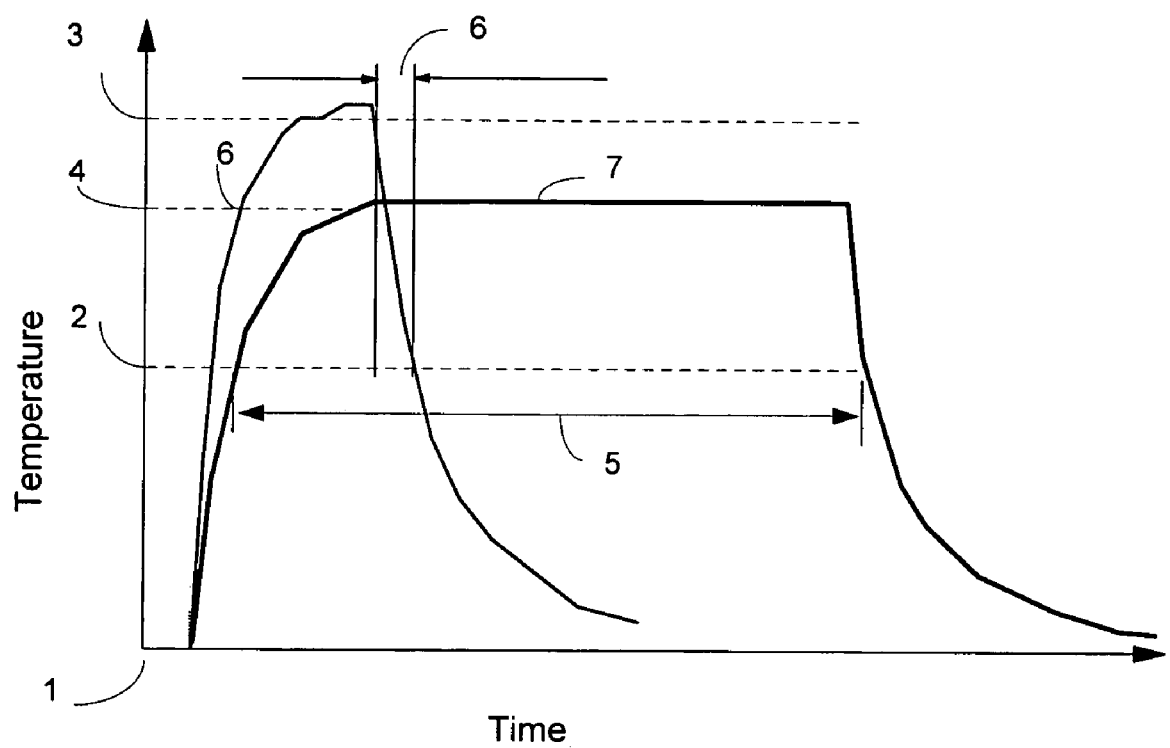
FIG. 1 is a schematic graph illustrating the relationship between temperature and time to the phase-changing properties of a phase-change resistive element.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As discussed above, the electrical resistance of phase-change materials can be changed significantly by external influences, including temperature, magnetic fields and electric fields. In their amorphous states, these phase-change materials exhibit a higher resistance because electrons move slower through the material. In semi-crystalline or semi-amorphous states, resistance switching materials can exhibit less resistance. Finally, in their crystalline states, resistance switching materials exhibit low resistance because electrons are able to move fast through the material. Electric pulses can be applied to theses phase-change materials in order to set them to their crystalline, low resistance, states, or to reset them to their amorphous, high resistance, states. This process of applying electric pulses to the phase-change material can be referred to as programming, tuning, trimming, etc. Specifically, "set" pulses are applied to tune the resistance of the phase-change material towards its crystalline state and "reset" pulses are applied to tune the resistance of the phase-change material towards its amorphous state. Electric impulses with higher pulse heights equate to higher temperatures.

FIG. 1, illustrates an exemplary reset programming curve 6 compared to exemplary set programming curve 7 for a resistor comprising a phase-change material. Referring to curve 7, in order to fully crystallize the phase-change material during set programming, the temperature of the phase-change material is brought to a given temperature 4 above the crystallization temperature 2 and held for a given period of time 5, depending upon the material. Referring to curve 6, in order to fully amorphize the phase-change material, during reset programming, the phase-change material is brought above the melting temperature 3. However, minimal time should be spent above melting temperature 3 in order to avoid heating surrounding materials in the resister or integrated circuit. Additionally, after the material is reset, the temperatures should be rapidly decreased below the crystallization temperature 2, to avoid returning to the crystalline phase. Therefore, consecutive electric pulses with different heights (i.e., temperatures) and widths (i.e., lengths of time) can be use to perform set or reset operations (e.g, high temperature, short duration pulses for setting, and lower temperature, longer duration pulses for resetting). Programming, as illustrated in FIG. 1, can be used to set a phase-change material in a resistance range of a few ohms to a kilo-ohm. Similarly, such programming can be used to reset a phase-change material in a resistance range of a kilo-ohm to a mega-ohm. However, such programming isn't sufficient for tuning a phase-change material to a target resistance with the tight tolerance necessary for some applications. For example, a 50-ohm termination network requires the resistance to be as close as possible to 50 ohms to ensure impedance matching to the 50 ohm transmission lines so that signal loss due to reflection is minimized. Also, resistors are often used to set a voltage level in a voltage reference generator circuit. Therefore, it is desirable that the resistances of such resistors don't vary across the wafer, from wafer to wafer, or from batch to batch. Generally, doped poly-silicon, or diffusion resistors can achieve only up to +/−20% of variation. The present invention relates to a method and apparatus for the precision tuning of one or more on-chip phase-change resistive elements. The method and apparatus may be used to program one or more resistive elements to a target resistance, to re-program the one or more resistive elements back to the target resistance if the resistance waivers, or to program the one or more resistive element to a different target resistance than originally programmed.

This disclosure presents a method and device for programming an on-chip phase-change resistive element or a network of on-chip phase-change resistive elements to a target resistance. Using an off-chip precision resistor, having a known resistance, as a reference, a state-machine analyzes the difference between the resistance of an on-chip phase-change resistor (or resistor network) compared to the target resistance. Based upon this difference, the state machine directs a pulse generator to apply set or reset pulses to the on-chip resistor (or to one or more resistors in the network) to decrease or increase, respectively, the resistance of the on-chip resistor (or the network), as necessary. In order to program the resistance of the on-chip resistor (or resistor network) to a tight tolerance, the on-chip resistor (or one or more resistors in the network) is successively reset and set by applying progressively decreasing numbers of reset pulses and set pulses, respectively, until the number of set pulses is equal to one and the target resistance of the on-chip resistor (or network of on-chip resistors) is reached.

Figure 2:
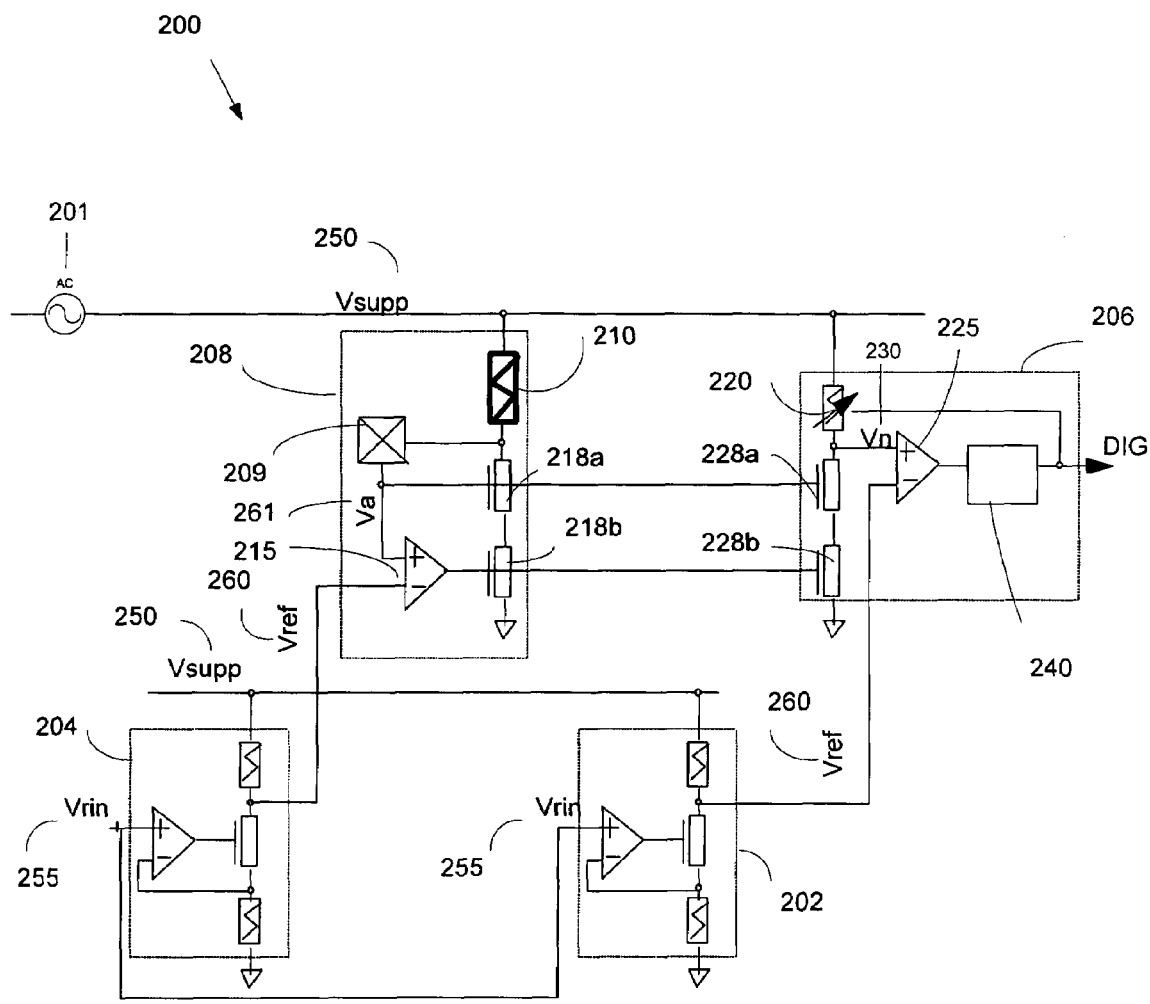
FIG. 2 is a schematic circuit diagram illustrating a read circuit of one embodiment of the device of the invention.
Figure 3:
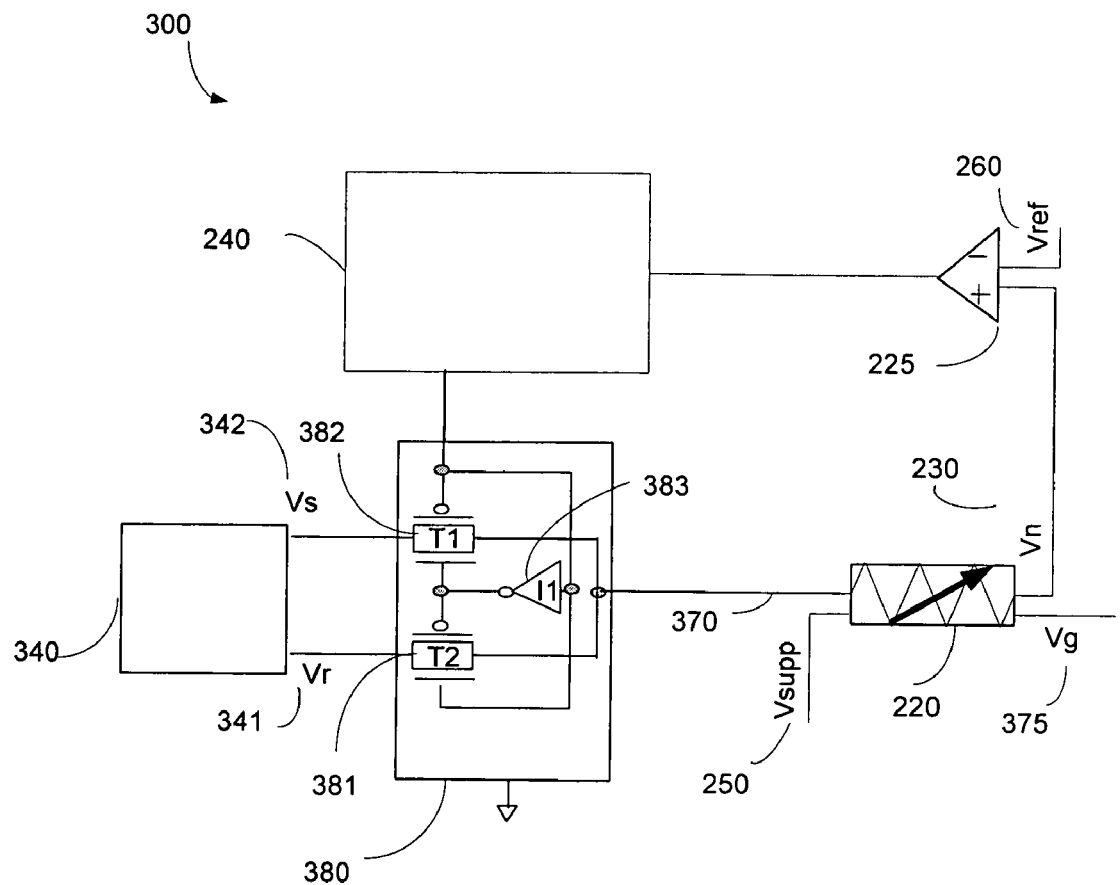
FIG. 3 is a schematic circuit diagram illustrating a programming circuit of one embodiment of the device of invention.

One embodiment of the invention comprises a device for programming a single on-chip resistor. Referring in combination to FIGS. 2 and 3, the device for programming a single on-chip resistor comprises a read circuit 200 and a programming circuit 300. The read circuit 200 is adapted to determine the relative resistance of the on-chip resistor 220 as compared to the target resistance. The programming circuit 300 is adapted to adjust the resistance of the on-chip phase-change resistor 220 to the target resistance in response to feedback from the read circuit 200.

Referring to FIG. 2, read circuit 200 comprises the on-chip resistor 220, an off-chip resistor 210, a state machine 240 and a power source 201. The off-chip resistor 210 (e.g., a precision resistor) has a known resistance and is electrically connected to the on-chip resistor 220. The power source 201 is adapted to input a supply voltage (Vsupp) 250 into the on-chip resistor 220 and the off-chip resistor 210. In order to read the resistance of the on-chip resistor 220 against the off-chip resistor 210, the off-chip resistor 210 is installed in a first calibration block 208 and the on-chip resistor 220 is installed in a second calibration block 206. In the first calibration block 208, the first node of the off-chip resistor 210 is electrically connected to the supply voltage 250 and the second node is electrically connected to a pad/pad protection circuit 209 and to a first tail device assembly 218. Similarly, in the second calibration block 206 the first node of the on-chip resistor 220 is also electrically connected to the supply voltage 250 and the second node is connected to a second tail device assembly 228 and to a second differential amplifier 225. The first 218 and second 228 tail device assemblies each comprises at least one corresponding tail device (e.g., 218a and 228a, 218b and 228b, etc.) The corresponding tail devices (e.g., 218a and 228a, 218b and 228b, etc.) are electrically connected. A current flows from the corresponding individual tail devices of the first tail device assembly 218 to the corresponding tail devices of the second tail device assembly 228. The pad/pad protection circuit 209 in the first calibration block 208 is connected to the off-chip resistor 210 and is adapted to measure the voltage output 261 of the off-chip resistor 210. The pad protection circuit 209 also shields the read circuit 200 from overstress due to electrostatic discharge (ESD) (i.e., to avoid damage to the circuit if a surge current or voltage is encountered). A first differential amplifier 215 connected to the pad 209 is adapted to compare the voltage output 261 of the off-chip resistor 210 to a predetermined reference voltage 260. The first differential amplifier then regulates the current flow so that a constant current flows through the tail devices 218a–b of the first tail device assembly 218 to the tail devices 228a–b, respectively, of the second tail device assembly 228. When the current flowing between the corresponding tail device assemblies 218, 228 is constant and mirrored, then any difference between the output voltage 230 of the on-chip resistor 220 and the predetermined reference voltage 260 indicates a difference in the resistance of the off-chip resistor 210 as compared to the on-chip resistor 220. A second differential amplifier 225 is adapted to detect an output voltage 230 from the on-chip resistor 220 and to compare it to the predetermined reference voltage 260. A state-machine 240 electrically connected to the second differential amplifier 225 is adapted to analyze the difference between the predetermined reference voltage 260 and the output voltage 230. The predetermined reference voltage 260 should be equal to the supply voltage 250 reduced by a predicted amount of voltage consumption by the read circuit 200. The predicted amount of voltage consumption is based upon the known resistance of the off-chip resistor 210 and the target resistance 400 (see FIG. 4b) of the on-chip resistor 220. Thus, if the output voltage 230 is greater than the reference voltage 260, then the resistance of the on-chip resistor 220 is less than the target resistance 400 and if the output voltage 230 is less than the reference voltage 260, then the resistance of the on-chip resistor is greater than the target resistance 400. If the output voltage 230 is equal to the reference voltage 260, then the resistance of the on-chip resistor 220 is equal to the target resistance 400 The state machine 240 analyzes the difference between the output voltage 230 of the on-chip resistor and the predetermined reference voltage 260 in order to determine if a setting process or resetting process is necessary.

The read circuit 200 can also comprise two identical biasing circuits 202, 204 to establish and to direct the same predetermined reference voltage 260 towards the first differential amplifier 215 connected to the off-chip resistor 210 and the second differential amplifier 225 connected to the on-chip resistor 220, respectively. Specifically, each biasing circuit 202, 204 can comprises an internally generated bias (Vrin) 255, for example for a resistor divider, used together with a differential amplifier, a MOS device, and two resistors (e.g., R0 and R1) to set the voltage reference 260 to be about the change in voltage level (delta v) below the supply voltage 250 (i.e., R0*R1/Vrin). As discussed above, the reference voltage 260 should be set to a voltage level below the supply voltage 250 such that if the on-chip resistor 220 has a resistance equal to the target resistance 400, then when the supply voltage 250 passes through the read circuit 200 the reference voltage 260 will equal the output voltage 230. The value of delta-v is carefully chosen so that a proper amount of current will be consumed to reach a target resistor value. Here, the voltage consumption across the off-chip resistor 210 and on-chip resistor 220 is fixed at delta-v. The flow of current between the first and second tail devices 218, 228 determines the current flow through the off-chip and on-chip resistors 210, 220. The second differential amplifier 215 will regulate the current from the first calibration block 208 to the second calibration block 208 based on the size ratio between the first tail device 218 and the second tail device 228. If resistance of the off-chip resistor 210 is 1/n of the resistance of the on-chip resistor 220, then the size of the tail device 218b will be n times the size of the tail device 228b. This configuration ensures that a correct amount of current will flow through the on-chip resistor 220 in the second calibration block 206.

Referring to FIG. 3, the programming circuit 300 comprises a multiplexer 380 electrically connected to the state machine 240 and the on-chip resistor 220; and, a pulse generator 340 electrically connected to the multiplexer 380. The pulse generator 340 is adapted to jointly output reset pulses (Vr) 341 and set pulses (Vs) 342 to the multiplexer 380. The multiplexer 380 is adapted to separately output the reset pulses 341 and the set pulses 342 to the on-chip resistor 220. The state machine 240 is adapted to compare output voltage 230 to the reference voltage 260 after each group of set pulses 342 and reset pulses 341 is applied to the on-chip resistor 220. Based upon this comparison, the state machine 240 is adapted to determine the resistance adjustment required for the on-chip resistor 220 and to control the multiplexer 380 by directing the multiplexer 380 to output a given number (i.e., a group) of reset pulses 341 or set pulses 342. The multiplexer 380 can be configured with a switch 383 between simple transmission gates 382, 381 to allow either set pulses 342 or reset pulses 341 to flow to the on-chip resistor 220, as directed by the state machine 240.

Figure 4A:
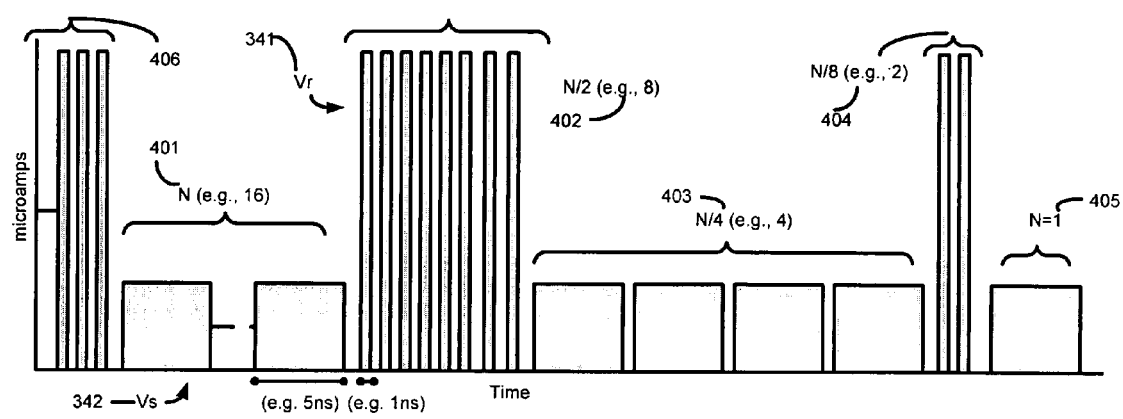
FIGS. 4*a–b* are schematic graphs illustrating an embodiment of the method of the present invention.
Figure 4B:
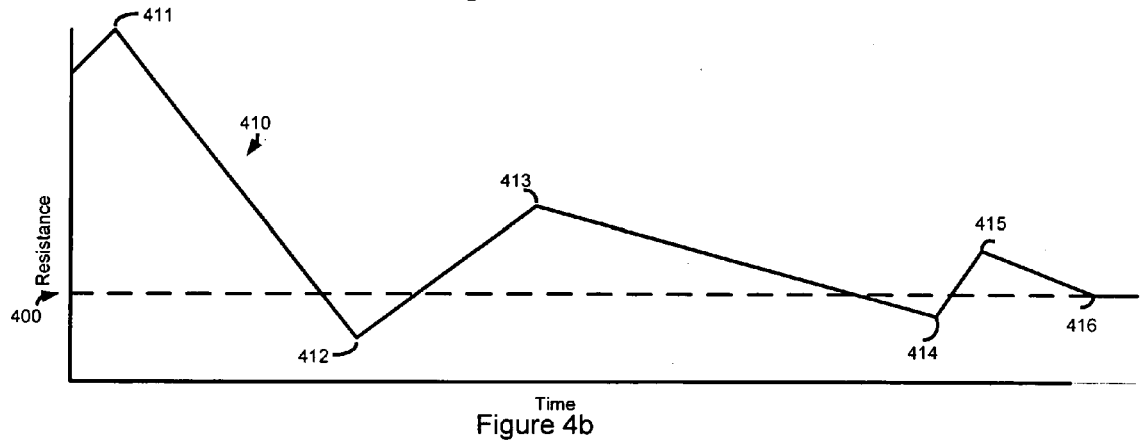

The state machine 240 can be adapted to direct the multiplexer 380 to output a group of set pulses 342 from the pulse generator 340 when the reference voltage 260 is greater than the output voltage 230, thereby indicating that the resistance of the on-chip resistor 220 is greater than the target resistance, and to output a group of reset pulses 341 when the reference voltage 260 is less than the output voltage 230, thereby indicating that the resistance of the on-chip resistor is less than the target resistance. Referring to FIGS. 4a and 4b in combination with FIG. 3, in order to program the on-chip phase-change resistor 220 to a target resistance 400, the state machine 240 can be configured with an algorithm to direct the multiplexer 380 to output a first group 406 of reset pulses 341 from the pulse generator 340, to then output a first group 401 of set pulses 342, and finally to output successive alternating groups (e.g., 402–405) of reset pulses 341 and set pulses 342. The given number of reset pulses of the first group 406 of reset pulses 341 should be sufficient to reset the resistance of the on-chip phase-change resistor 220 to a maximum resistance (see position 411 above the target resistance 400 on the resistance programming curve 410 of FIG. 4b). The given number N of set pulses of the first group 402 of set pulses 342 should be sufficient to set the resistance of the on-chip phase-change resistor 220 to a resistance that is less than the target resistance 400 (see position 412 below the target resistance 400). The given number of pulses of the alternating groups (e.g., 402–405) should be progressively decreasing, but sufficient to successively reset and set the resistance of the on-chip phase-change resistor 220 above and below the target resistance 400 (e.g., see positions 413–415), until the given number of pulses is equal to one (e.g., see group 405 of FIG. 4a) and the target resistance 400 is reached (see position 416 of FIG. 4b). If applying a group of setting or resetting pulses does not adequately set or reset the resistance of the phase change material, the state machine can be adapted to reapply the same group of set or reset pulses.

Figure 5:
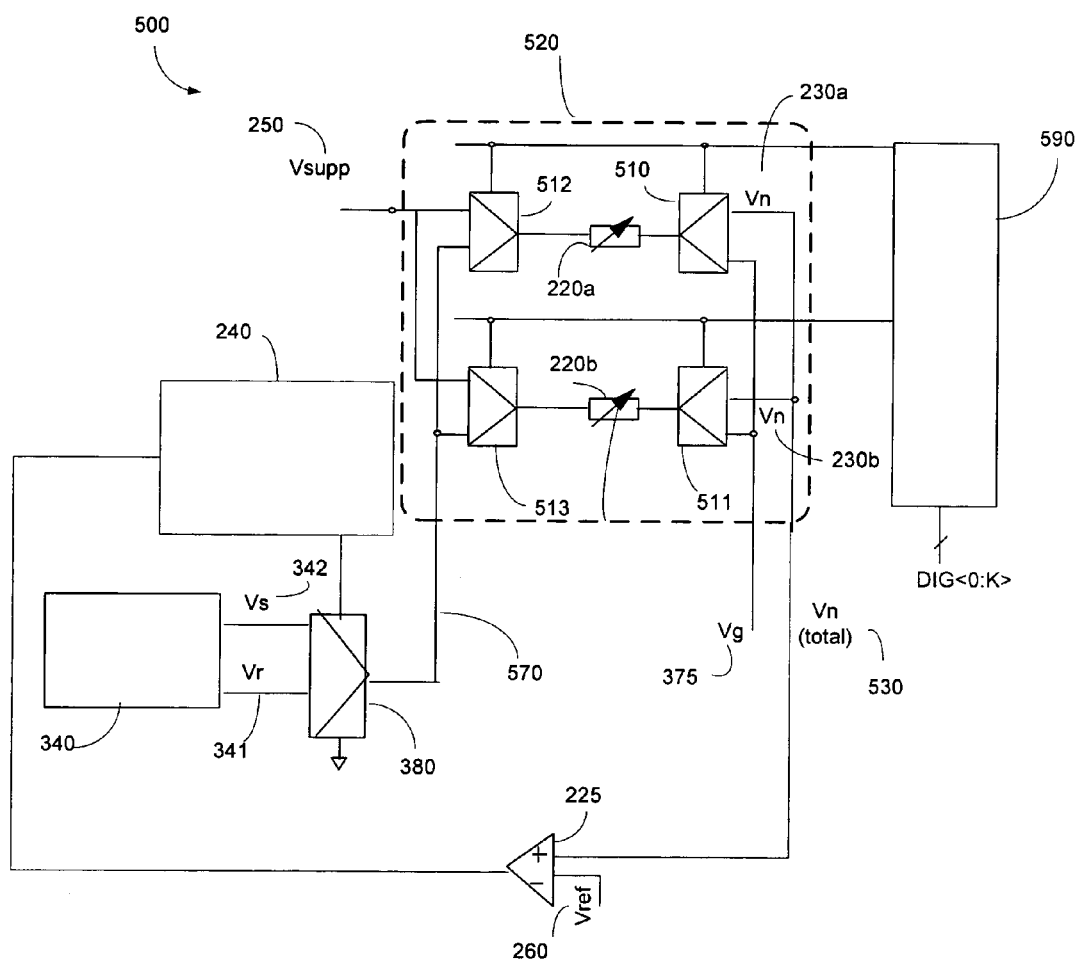
FIG. 5 is a schematic circuit diagram illustrating a programming circuit of another embodiment of the device of the invention.

Another embodiment of the invention comprises a device for programming a network 520 of on-chip resistors (e.g., 220a, 220b, etc.). Referring to FIGS. 2 and 5 in combination, the device comprises a read circuit 200 and a programming circuit 500. The read circuit 200 is adapted to determine the relative resistance of the network 520 as compared to the target resistance 400 (see FIG. 4b) of the network 520. The read circuit 200 is configured as illustrated in FIG. 2 and as described above with regard to a device for programming a single on-chip resistor. However, in addition to the features illustrated in FIG. 2 the read circuit 200 of this embodiment also comprises the entire resistor network 520 as illustrated in FIG. 5. Additionally, the predicted voltage consumption amount used for determining the reference voltage 260 established by the biasing circuits 202, 204, is based upon the voltage consumption of the off-chip resistor and the voltage consumption of the entire on-chip resistor network 520 during the read process. Thus, the output voltage 530 processed by the state machine 240 is the total output voltage of the entire network 520, not an individual output voltage (e.g., 230a, 230b, etc.) detected from an individual resistor (e.g., 220a, 220b, etc.) in the network 520.

Referring to FIG. 5, the programming circuit 500 is more complex than the programming circuit 300 of the previously described embodiment, because one or more individual resistors (e.g., 220a) in the network 520 is selected for programming and detached from the network 520 during the programming process in order to receive the reset 341 or set 342 pulses, without setting or resetting unselected resistors in the network. The selected resistor 220a is then reconnected to the network 520 during the read process, so the total output voltage 530 can be detected. A decoder 590 is electrically connected to each of the on-chip resistors (e.g., 220a, 220b, etc.) in the network 520 via two different sets of multiplexers and is adapted to select at least one of the on-chip resistors (e.g., either 220a or 220b, or both 220a–b) via these multiplexers for programming.

The programming circuit 500 also comprises a multiplexer 380 electrically connected to the state machine 240 and the network 520 via network wire 570. A pulse generator 340 is electrically connected to the multiplexer 380. As described above with regard to the previous embodiment, the pulse generator 340 is adapted to jointly output reset pulses 341 and set pulses 342 to the multiplexer 380. The multiplexer 380 is adapted to separately output the reset pulses 341 and the set pulses 342 to the network 520 via network wire 370. The state machine 240 can be adapted to compare the total output voltage 530 of the network 520 to the reference voltage 260 after each group of reset pulses 341 and set pulses 342 are applied to the on-chip resistor 220a that is selected by the decoder 590 for programming. Based upon this comparison, the state machine 240 is adapted to control the multiplexer 380 by directing the multiplexer 380 to output a given number (i.e., a group) of either reset pulses 341 or set pulses 342 from the pulse generator 340 to the network wire 570 in order to adjust the overall resistance of the network 520. The state machine 240 can be configured with an algorithm to direct the multiplexer 380 to output a group of set pulses 342 when the reference voltage 260 is greater than the total output voltage 530, thereby indicating that the resistance of the network 520 is greater than the target resistance (see 400 of FIG. 4b), and to output a group of reset pulses 341 when the reference voltage 530 is less than the total output voltage 530, thereby indicating that the resistance of the network 560 is less than the target resistance 400. Specifically, referring to FIGS. 4a–4b in combination with FIG. 5, in order to program the at least one on-chip resistor 220a and thereby adjust the resistance of the network 520 to the target resistance 400, the state machine 540 can direct the multiplexer 380 to output a first group 406 of reset pulses 341, to output a first group 401 of set pulses 342, and to output successive alternating groups (e.g., 402–405) of reset pulses 341 and set pulses 342. The given number of the reset pulses 341 of the first group 406 of reset pulses should be sufficient to reset the resistance of the on-chip phase-change resistor 220 of the at least one on-chip resistor 220a to a maximum resistance and, thereby, increase the overall resistance of the network (e.g., see position 411 of the programming curve 410 of FIG. 4b). The given number of the set pulses 342 of the first group 401 of set pulses should be sufficient to set the resistance of the selected on-chip phase-change resistor 220a to a resistance that decreases the overall resistance of the network 520 below the target resistance 400 (e.g., see position 412). The given number of the pulses of the alternating groups (e.g., 402–405) should progressively decrease, but be sufficient to successively set and reset the resistance of the at least one on-chip resistor 220a such that the overall resistance of the network 520, respectively, rises above (e.g., see position 413) and drops below (e.g., see position 414) the target resistance 400, until the given number of pulses is equal to one (e.g., group 405) and the target resistance 400 is reached (e.g., position 416).

As mentioned above, the decoder 590 is electrically connected to multiplexers that are used to disconnect and reconnect the selected resistor 220a, as necessary. One set of multiplexers (e.g., second multiplexers 512, 513) are each electrically connected to the decoder 590, the multiplexer 380, the power source 201 (not shown), and to a corresponding on-chip resistor (e.g., 220a, 220b, respectively) in the network 520. Another set of multiplexers (e.g., third multiplexers 510, 511) are each electrically connected to the decoder 590, a ground line 375, a total output voltage line 530 and a corresponding one of the on-chip resistors (e.g., 220a, 220b, respectively) in the network 520. The decoder 590 is further adapted to transmit a read signal to each of the second multiplexers 512, 513 and third multiplexers 510, 511 when the network 520 is being read or in operation and to transmit a programming signal to a corresponding a second multiplexer (e.g., 512) and third multiplexer (e.g., 510) when the corresponding on-chip resistor (e.g., 220a) is selected for programming. Specifically, the decoder 590 with input DIG <0:K> is configured to produce select signals (e.g., sel<0>, sel<1>). For example, a programming signal can be a sel<1> signal and a read can be a sel<0> signal. Each resistor (e.g., 220a, 220b, etc.) in a network 520 can be selected sequentially for programming. Additionally, more than one resistor (e.g., 220a and 220b) in a network 520 may be simultaneously selected for programming the entire network 520 using conventional binary decoding methods. Each of the second multiplexers (e.g., 512) is adapted to temporarily disconnect the corresponding on-chip resistor (e.g., 220a) from the network 520 and to output set 342 or reset 341 pulses received from the multiplexer 380 to the corresponding on-chip resistor (e.g., 220a), upon receiving a program signal (e.g., sel<1>). Each of second multiplexers (e.g., 512) is further adapted to reconnect the corresponding on-chip resistor (e.g., 220a) to the network 520 and to output the supply voltage 250 from the power source 201 (not shown) back to the network 520, upon receiving a read signal (e.g., sel<0>). Each of the third multiplexers (e.g., 510) is adapted to receive an individual output voltage (e.g., 230a) from the corresponding on-chip resistor (e.g., 220a), to output the individual output voltage (e.g., 230a) to the total output voltage line 530 upon receiving the read signal (e.g., sel<0>), and to output the individual output voltage (e.g., 230a) to the ground line 375 upon receiving the programming signal (e.g., sel<1>). The second multiplexers 512, 513 can be configured with a switch between simple transmission gates to allow either set pulses 341, 342 (during programming) or the supply voltage 250 (during reading) to flow to the on-chip resistor 220, as directed by the decoder 590. The third multiplexers 510, 511 can be configured with a simple switch to transmit the individual output voltage (e.g. 220a) to ground 375 (during programming) or to the total voltage output 530 (during reading), also as directed by the decoder 590.

Figure 6:
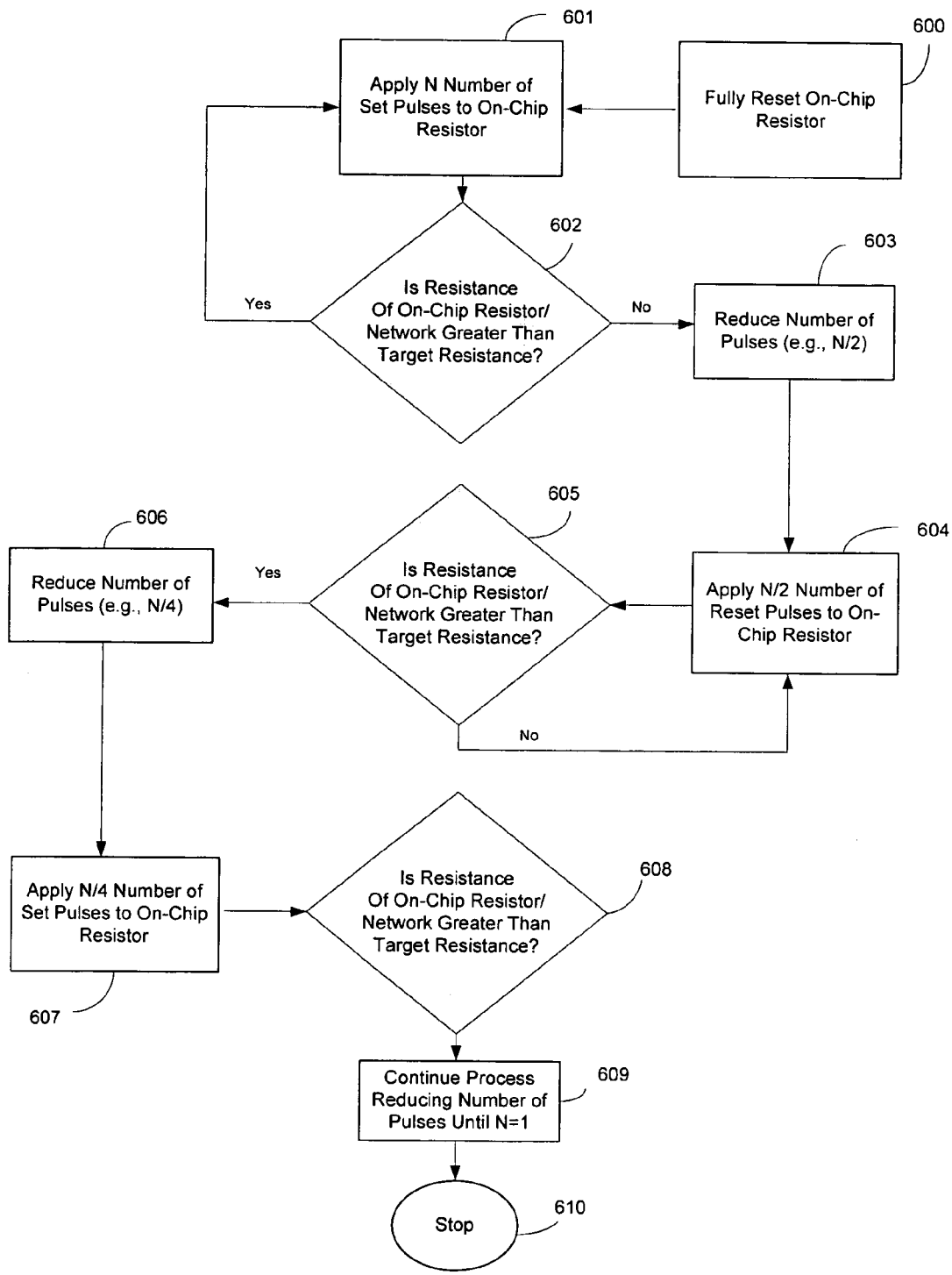
FIG. 6 is a schematic flow diagram illustrating an embodiment of the method of the invention.

Referring to FIG. 6, additional embodiments of the invention comprise methods for programming a single on-chip phase-change resistor or a network of on-chip phase-change resistors to a target resistance. The methods are essentially the same; however, there are a few additional method steps required for programming a network 520. For example, given a network 520 of on-chip resistors (e.g., 220a, 220b, etc.) at least one on-chip resistor (e.g., 220a) is selected for programming (e.g, by decoder 590 of FIG. 5, discussed above) and then, temporarily disconnected from the network 520 (e.g., by second and third multiplexers 512, 510, as directed by the decoder 590, see FIG. 5 discussed above). The on-chip resistor 220 (or selected on-chip resistor 220a of a network 520) is reset to a maximum resistance by applying a first group (e.g., group 406 of FIG. 4a) of a predetermined number of reset pulses 341 (600). Resetting the on-chip resistor 220, 220a sets the resistance programming curve 410 to a maximum position 411 above the target resistance 400 (see FIG. 4b). Then, the resistance of the resistor 220 (or the overall resistance of the resistor network 520) is set to a position 412 that is less than the target resistance 400 by applying a first group of a predetermined number of set pulses 342 to the on-chip resistor 220 (or selected on-chip resistor 220a in the network 520) (601). For example, referring to FIG. 4a, a first group 401 of 16 set pulses (e.g., 20 µa, 5 ns, pulses) can be applied to the resistor 220, 220a. The predetermined number of set pulses for process (601) can be determined as that number of pulses that is divisible by an integer N, where N is less than 10 (e.g., N=4) and sufficient to decrease the resistance of the resistor 220 (or the overall resistance of the resistor network 520) below the target resistance 400. After completing process (601), the output voltage 230 of the on-chip resistor 220 (see FIG. 2) (or the output voltage 530 of the resistor network 520 (see FIG. 5)) is compared to the reference voltage 260 (602) using a read circuit 200 (see FIG. 2). Note that if the a network 520 is being programmed, then the selected on-chip resistor 220a is reconnected to the network 520, while the comparison is being made at process 602 and also at process 605 and 608, discussed below. For example, the selected on-chip resistor 220a may be reconnected to the network by second and third multiplexers 512, 510, as directed by the decoder 590 (see FIG. 5 discussed above). The comparison of the resistance of the on-chip resistor 220 (or the overall resistance of the network 520) to the target resistance 400 is based upon a predetermined reference voltage 260 that is established by two identical biasing circuits 202, 204. The reference voltage 260 is determined such that it is equal to the supply voltage 250 reduced by a predicted amount of voltage consumed by the read circuit 200 during the process (602). The predicted amount of voltage consumption is based upon the known resistance of the off-chip resistor and the target resistance of the on-chip resistor 220 (or resistor network 520).

Specifically, a supply voltage 250 is input into the off-chip resistor 210 and into the on-chip resistor 220 (or resistor network 520) and then an output voltage 230 for the resistor 220 (or an overall output voltage 530 for the resistor network 520) is detected from the read circuit 200. If the output voltage 230 of the resistor (or the overall output voltage 530 of the resistor network 520) is greater than the reference voltage 260, then the resistance of the resistor 220 (or resistor network 520) is less than the target resistance 400, and vice versa. If the resistance of the on-chip resistor 220 (or the resistor network 520) is still higher than the target resistance 400, the process (601) is repeated. If not, then the number of pulses N is decreased, for example by half, (603) and a group of reset pulses (e.g., n/2 reset pulses) is applied to the resistor 220 (or the selected resistor 220a) (604). For example, referring to FIG. 4a, a second group 402 of 8 reset pulses 341 (e.g., 100 µa, 1 ns, pulses) can be applied to the resistor 220 (or selected resistor 200a) in order to bring the resistance of the resistor 220 (or the resistor network 520) to a position (e.g., 412 of FIG. 4b) below the target resistance 400. The output voltage 230 of the on-chip resistor 220 (or the overall output voltage 530 of the resistor network 520) is again compared to the reference voltage 260 (605). If the resistance of the on-chip resistor 220 (or the resistor network 520) is still lower than the target resistance 400, the process (604) is repeated. If not, then the number of pulses N is decreased, for example by one-quarter, (606) and another group of set pulses (e.g., n/4 reset pulses) is applied to the resistor 220, 220a (607). For example, referring to FIG. 4a, another group 403 of 4 set pulses 342 can be applied to the resistor 220, 220a. The output voltage 230 (or overall output voltage 530) is again compared to the reference voltage 260 (608). Thereafter, alternating groups of reset pulses 341 and set pulses 342, having progressively decreasing numbers of pulses (e.g., groups 404-405 of FIG. 4a) are applied to the on-chip resistor 220 (or selected on-chip resistor 220a) in order to successively reset and set the resistance of the on-chip resistor 220 (or the resistor network 520) to a resistance that is progressively closer to the target resistance 400, until N is equal to one and the target resistance 400 is reached (609).

Thus, disclosed above is a technique for programming an on-chip phase-change resistive element or a network of on-chip phase-change resistive elements to a target resistance. Using an off-chip precision resistor as a reference, a state-machine determines the difference between the resistance of the on-chip resistor (or resistor network) and the target resistance. Based upon this difference, the state machine directs a pulse generator to apply set or reset pulses to the on-chip phase-change resistor (or to one or more selected on-chip phase-change resistors in a network) to decrease or increase, respectively, the resistance of the on-chip resistor (or resistor network), as necessary. In order to program the resistance of the on-chip phase-change resistor (or resistor network) to a tight tolerance, the on-chip resistor (or the selected on-chip resistor(s) in the network) is successively reset and set by applying progressively decreasing numbers of reset pulses and set pulses, respectively, until the number of set pulses is equal to one and the target resistance of the on-chip resistor (or network of on-chip resistors) is reached. The method and apparatus may be used to program one or more resistive elements to a target resistance, to re-program the one or more resistive elements back to the target resistance if the resistance waivers, or to program the one or more resistive elements to a different target resistance than originally programmed.

While the invention has been described in terms of embodiments, those skilled in the art will recognize that the invention can be practiced with modification within the spirit and scope of the appended claims.

What is claimed is:

1. A method of programming an on-chip phase-change resistor to a target resistance, said method comprising:
   providing an off-chip resistor with a known resistance;
   establishing a constant current between said off chip resistor and said on-chip resistor;
   comparing an output voltage of said on-chip resistor to a predetermined reference voltage; and
   programming said on-chip resistor until said output voltage is equal to said predetermined reference voltage,
   wherein said predetermined reference voltage is equal to a supply voltage reduced by a predicted voltage consumption given said known resistance of said off-chip resistor and said target resistance of said on-chip resistor.

2. The method of claim 1, wherein said programming of said on-chip resistor comprises:
   resetting said on-chip resistor to a maximum resistance by applying a predetermined number of reset pulses to said on-chip resistor;
   setting said on-chip resistor to a resistance that is less than said target resistance by applying a predetermined number of set pulses to said on-chip resistor; and
   successively resetting and setting said on-chip resistor to a resistance that is progressively closer to said target resistance by applying alternating groups of reset pulses and set pulses to said on-chip resistor with a progressively decreasing numbers of pulses.

3. The method of claim 2, wherein said applying of said predetermined number of set pulses comprises determining said predetermined number of set pulses such that said predetermined number of set pulses is divisible by an integer less than ten and is sufficient to set said resistance of said on-chip resistor to be less than said target resistance.

4. The method of claim 3, further comprising: dividing a number of pulses of a previous group of pulses by two to determine said number of pulses for a next alternating group; and, continuing said process of resetting and setting said on-chip resistor until said number of pulses is equal to one.

5. The method of claim 4, wherein said comparing of said output voltage to said predetermined reference voltage further comprises comparing said output voltage to said predetermined reference voltage between said applying of said alternating groups of said reset pulses and said set pulses.

6. The method of claim 5, further comprising determining if said on-chip resistor requires one of said setting process and said resetting process based upon said comparing of said output voltage to said predetermined reference voltage.

7. The method of claim 6, wherein said determining if said on-chip resistor requires one of said setting process and said resetting process further comprises:
   determining that said setting process is required when said reference voltage is greater than said output voltage, thereby indicating that said resistance of said on-chip resistor is greater than said target resistance; and
   determining that said resetting process is required when said reference voltage is less than said output voltage, thereby indicating that said resistance of said on-chip resistor is less than said target resistance of said off-chip resistor.

8. The method of claim 7, further comprising:
   if, after applying one of said groups of set pulses, said reference voltage is greater than said output voltage, then reapplying said group of set pulses; and
   if, after applying one of said groups of reset pulses, said reference voltage is less than said output voltage, then reapplying said group of reset pulses.

9. A method of programming a network of on-chip phase-change resistors to a target resistance, said method comprising:
   providing an off chip resistor with a known resistance;
   establishing a constant current between said off chip resistor and said network of on-chip resistors network using a circuit;
   comparing an output voltage of said on-chip resistor in said circuit to a predetermined reference voltage; and
   programming at least one on-chip resistor in said on-chip resistor network until said output voltage is equal to said predetermined reference voltage,
   wherein said predetermined reference voltage is equal to a supply voltage reduced by a predicted voltage consumption of said circuit given said known resistance of said off-chip resistor and said target resistance of said on-chip resistor network.

10. The method of claim 9 wherein said programming of said at least one on-chip resistor in said network of on-chip resistors comprises:
    resetting said at least one on-chip resistor in said network to a maximum resistance by applying a predetermined number of reset pulses to said at least one on-chip resistor;
    setting said phase-change material of said at least one on-chip resistor in said network in order to decrease said resistance of said network to less than said target resistance by applying a predetermined number of set pulses to said at least one on-chip resistor; and
    successively resetting and setting said at least one on-chip resistor in order to adjust said resistance of said network progressively closer to said target resistance by applying alternating groups of reset pulses and set pulses with progressively decreasing numbers of pulses to said one on-chip resistor.

11. The method of claim 10, wherein said applying of said predetermined number of set pulses comprises determining said predetermined number of set pulses such that said predetermined number of set pulses is divisible by an integer less than ten and is sufficient to set said resistance of said on-chip resistor to be less than said target resistance.

12. The method of claim 11, further comprising:
    dividing a number of pulses of a previous group of pulses by two to determine said number of pulses for a next alternating group; and, continuing said process of resetting and setting said at least one on-chip resistor until said number of pulses is equal to one.

13. The method of claim 12, wherein said comparing of said output voltage to said predetermined reference voltage further comprises comparing said output voltage to said predetermined reference voltage between said applying of said alternating groups of said reset pulses and said set pulses.

14. The method of claim 13, further comprising determining if said at least one on-chip resistor requires one of said setting process and said resetting process based upon said comparing of said output voltage to said predetermined reference voltage.

15. The method of claim 14, wherein said determining if said at least one on-chip resistor requires one of said setting process and said resetting process further comprises:
    determining that said setting process is required when said reference voltage is greater than said output voltage, thereby indicating that said resistance of said on-chip resistor network is greater than said target resistance; and
    determining that said resetting process is required when said reference voltage is less than said output voltage, thereby indicating that said resistance of said on-chip resistor network is less than said target resistance of said off-chip resistor.

16. The method of claim 15, further comprising:
    if, after applying one of said groups of set pulses, said reference voltage is greater than said output voltage, then reapplying said group of set pulses; and
    if, after applying one of said groups of reset pulses, said reference voltage is less than said output voltage, then reapplying said group of reset pulses.

17. A device for programming the resistance of an on-chip phase-change resistor to a target resistance, said device comprising:
    said on-chip resistor;
    an off-chip resistor, having a known resistance, electrically connected to said on-chip resistor;
    a state-machine electrically connected to said on-chip resistor; and
    a power source electrically connected to said on-chip resistor and said off-chip resistor and adapted to input a supply voltage to said on-chip resistor and said off-chip resistor,
    wherein a predetermined reference voltage is equal to said supply voltage reduced by a predicted amount of voltage consumption by said on-chip resistor and said off-chip resistor,
    wherein said predicted amount of voltage consumption is based upon said known resistance of said off-chip resistor and said target resistance of said on-chip resistor, and
    wherein said state-machine is adapted to analyze a difference between an output voltage from said on-chip resistor and said predetermined reference voltage to determine a resistance of said on-chip resistor compared to a known resistance of said off-chip resistor.

18. The device of claim 17, further comprising a read circuit, wherein said read circuit further comprises:
    a first differential amplifier electrically connected to said off-chip resistor;

a first tail device assembly electrically connected to said off-chip resistor and said first differential amplifier; and a second tail device assembly electrically connected to said first tail device assembly and to said on-chip resistor, wherein said first differential amplifier is adapted to regulate a current flow between said off-chip resistor and said on-chip resistor via said first tail device assembly and said second tail device assembly so that said current flow is constant.

19. The device of claim 18, further comprising a second differential amplifier electrically connected to said on-chip resistor and said state machine, wherein said second differential amplifier is adapted to compare said output voltage of said on-chip resistor to said predetermined reference voltage and to transmit said difference to said state machine.

20. The device of claim 17, further comprising:

a programming circuit adapted to adjust said resistance of said on-chip resistor to said target resistance, said programming circuit comprising:

a multiplexer electrically connected to said state machine and said on-chip resistor; and a pulse generator electrically connected to said multiplexer, wherein said pulse generator is adapted to jointly output reset pulses and set pulses to said multiplexer, wherein said multiplexer is adapted to separately output said reset pulses and said set pulses to said on-chip resistor, and wherein said state machine is adapted to control said multiplexer by directing said multiplexer to output a given number of one of said reset pulses and said set pulses.

21. The device of claim 20, wherein said state machine is adapted to direct said multiplexer to output a first group of reset pulses, to output a first group of set pulses, and to output successive alternating groups of reset pulses and set pulses, wherein said given number of said reset pulses of said first group of reset pulses is sufficient to reset said resistance of said on-chip resistor to a maximum resistance, wherein said given number of said set pulses of said first group of set pulses is sufficient to set said resistance of said on-chip resistor to a resistance that is less than said target resistance, and wherein said given number of said pulses of said alternating groups progressively decreases, but is sufficient to successively reset and set said resistance of said on-chip resistor, respectively, above and below said target resistance, until said given number of said pulses is equal to one and said target resistance is reached.

22. The device of claim 21, wherein said state machine is further adapted to determine said given number of pulses for each of said alternating groups of reset pulses and set pulses.

23. The device of claim 21, further comprising a read circuit, wherein said read circuit is further adapted to determine said relative resistance of said on-chip resistor compared to said target resistance after each alternating group of said reset pulses and said set pulses is output to said on-chip resistor.

24. The device of claim 23, wherein said state machine is further adapted to direct said multiplexer to output said set pulses when said reference voltage is greater than said output voltage, thereby indicating that said resistance of said on-chip resistor is greater than said target resistance, and to output said reset pulses when said reference voltage is less than said output voltage, thereby indicating that said resistance of said on-chip resistor is less than said target resistance of said off-chip resistor.

25. A device for programming the resistance of a network of on-chip phase-change resistors to a target resistance, said device comprising:

said on-chip resistor network;

an off-chip resistor, having a known resistance, electrically connected to said on-chip resistor network;

a state-machine electrically connected to said on-chip resistor network; and a power source electrically connected to said on-chip resistor network and said off-chip resistor and adapted to input a supply voltage into said on-chip resistor network and said off-chip resistor, wherein a predetermined reference voltage is equal to said supply voltage reduced by a predicted amount of voltage consumption by said on-chip resistor network and said off-chip resistor;

wherein said predicted amount of voltage consumption is based upon said known resistance of said off-chip resistor and said target resistance of said on-chip resistor network, and wherein said state-machine is adapted to analyze a difference between an output voltage from said on-chip resistor and said predetermined reference voltage to determine a resistance of said on-chip resistor network compared to a known resistance of said off-chip resistor.

26. The device of claim 25, further comprising a read circuit, wherein said read circuit further comprises:

a first differential amplifier electrically connected to said off-chip resistor;

a first tail device assembly electrically connected to said off-chip resistor and said first differential amplifier; and a second tail device assembly electrically connected to said first tail device assembly and to said on-chip resistor, wherein said first differential amplifier is adapted to regulate a current flow between said off-chip resistor and said on-chip resistor via said first tail device assembly and said second tail device assembly so that said current flow is constant.

27. The device of claim 26, wherein said read circuit further comprises a second differential amplifier electrically connected to said on-chip resistor network and said state machine, wherein said second differential amplifier is adapted to compare said output voltage of said on-chip resistor network to said predetermined reference voltage and to transmit said difference to said state machine.

28. The device of claim 25, further comprising a programming circuit adapted to program said at least one on-chip resistor in said on-chip resistor network to adjust said resistance of said network to said target resistance, said programming circuit comprising:

a multiplexer electrically connected to said state machine and said network; and a pulse generator electrically connected to said multiplexer, wherein said pulse generator is adapted to jointly output reset pulses and set pulses to said multiplexer, wherein said multiplexer is adapted to separately output said reset pulses and said set pulses to said network, and wherein said state machine is adapted to control said multiplexer by directing said multiplexer to output a given number of one of said reset pulses and said set pulses.

29. The device of claim 28, wherein said programming circuit further comprises a decoder electrically connected to each of said on-chip resistors in said network and adapted to select at least one of said on-chip resistors in said network for programming.

30. The device of claim 29, further comprising:
a plurality of second multiplexers each electrically connected to said decoder, said multiplexer, said power source, and a corresponding one of said on-chip resistors in said network,
wherein said decoder is further adapted to transmit a read signal to each of said second multiplexers when said network is being read and to transmit a programming signal to a corresponding one of said second multiplexers when said corresponding on-chip resistor is selected for programming,
wherein each of said plurality of second multiplexers is adapted to temporarily disconnect said corresponding on-chip resistor from said network and to output said one of said reset pulses and said set pulses to said corresponding on-chip resistor, upon receiving said programming signal, and
wherein each of said plurality of second multiplexers is adapted to reconnect said corresponding on-chip resistor to said network and to output said supply voltage from said power source to said network, upon receiving said read signal.

31. The device of claim 29, further comprising:
a ground line;
a plurality of third multiplexers each electrically connected to said decoder, said ground line and a corresponding one of said on-chip resistors in said network; and
a total output voltage line connected to each of said third multiplexers and said state machine,
wherein said decoder is further adapted to transmit a read signal to each of said third multiplexers when said network is being read and to transmit a programming signal to a corresponding one of said third multiplexers when said corresponding on-chip resistor is selected for programming, and
wherein said plurality of third multiplexers are each adapted to receive an individual output voltage from said corresponding on-chip resistor, to output said individual output voltage to said total output voltage line upon receiving said read signal, and to output said individual output voltage to said ground line upon receiving said programming signal.

32. The device of claim 28, wherein said state machine is adapted to direct said multiplexer to output a first group of reset pulses, to output a first group of set pulses, and to output successive alternating groups of reset pulses and set pulses,
wherein said given number of said reset pulses of said first group of reset pulses is sufficient to reset said at least one on-chip resistor to a maximum resistance,
wherein said given number of said set pulses of said first group of set pulses is sufficient to set said at least one on-chip resistor to a resistance that decreases said resistance of said network below said target resistance, and
wherein said given number of said pulses of said alternating groups progressively decreases, but is sufficient to successively set and reset said at least one on-chip resistor such that said resistance of said network, respectively, rises above and drops below said target resistance, until said given number of said pulses is equal to one and said target resistance is reached.

33. The device of claim 32, wherein said state machine is further adapted to determine said given number of pulses for each of said groups of set pulses and reset pulses.

34. The device of claim 32, further comprising a read circuit, wherein said read circuit is further adapted to determine said relative resistance of said network as compared to said target resistance after each of said groups of said reset pulses and said set pulses is output to said network.

35. The device of claim 32, wherein said state machine is further adapted to direct said multiplexer to output a group of said set pulses when said reference voltage is greater than said total output voltage, thereby indicating that said resistance of said network is greater than said target resistance, and to output a group of said reset pulses when said reference voltage is less than said total output voltage, thereby indicating that said resistance of said network is less than said target resistance.

* * * * *